United States Patent
Wu

(10) Patent No.: US 12,154,914 B2
(45) Date of Patent: Nov. 26, 2024

(54) DISPLAY PANEL AND DISPLAY DEVICE

(71) Applicant: GUANGZHOU CHINA STAR OPTOELECTRONICS SEMICONDUCTOR DISPLAY TECHNOLOGY CO., LTD., Guangdong (CN)

(72) Inventor: Wei Wu, Guangdong (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 0 days.

(21) Appl. No.: 18/176,138

(22) Filed: Feb. 28, 2023

(65) Prior Publication Data

US 2024/0194697 A1 Jun. 13, 2024

(30) Foreign Application Priority Data

Dec. 12, 2022 (CN) .......................... 202211611054.2

(51) Int. Cl.
  *G02F 1/1333* (2006.01)
  *G02F 1/1343* (2006.01)
  *H01L 27/12* (2006.01)

(52) U.S. Cl.
  CPC .... *H01L 27/1248* (2013.01); *G02F 1/133345* (2013.01); *G02F 1/13439* (2013.01); *G02F 2202/16* (2013.01); *H01L 27/124* (2013.01)

(58) Field of Classification Search
  CPC ............ G02F 1/1333; G02F 1/133345; G02F 1/133357; G02F 1/1343; G02F 1/13439; G02F 1/134318; G02F 1/1362; G02F 1/136227; G02F 1/1368; G02F 2202/16; H01L 27/124; H01L 27/1248
  See application file for complete search history.

(56) References Cited

U.S. PATENT DOCUMENTS

| | | | |
|---|---|---|---|
| 2010/0140599 A1* | 6/2010 | Yano | H10K 50/30 438/46 |
| 2013/0043476 A1* | 2/2013 | Sung | H01L 27/124 257/E29.273 |
| 2020/0027958 A1* | 1/2020 | Suzuki | H01L 29/66969 |
| 2020/0285124 A1* | 9/2020 | Duan | H01L 27/1262 |
| 2022/0077318 A1* | 3/2022 | Kikuchi | H01L 21/30604 |
| 2023/0320135 A1* | 10/2023 | Hosaka | H01L 27/124 257/40 |

* cited by examiner

*Primary Examiner* — Thoi V Duong

(74) *Attorney, Agent, or Firm* — PV IP PC; Wei Te Chung

(57) ABSTRACT

Disclosed are a display panel and a display device, wherein the display panel includes an opposing substrate, a liquid crystal layer, and an array substrate, the liquid crystal layer is disposed between the opposing substrate and the array substrate; the array substrate includes a base, a first inorganic film layer and a conductive layer, the first inorganic film layer is disposed on the base and has a refractive index greater than or equal to 1.4 and less than or equal to 1.6, the conductive layer is disposed on the base, and the conductive layer is adjacent to the first inorganic film layer.

14 Claims, 2 Drawing Sheets

DISPLAY PANEL AND DISPLAY DEVICE

CROSS-REFERENCE TO RELATED APPLICATIONS

The present disclosure claims the benefit of priority of Chinese Patent Application No. 202211611054.2 filed on Dec. 12, 2022, the contents of which are all incorporated herein by reference in its entirety.

TECHNICAL FIELD

The present disclosure relates to the field of displaying, and in particular, to a display panel and a display device.

BACKGROUND

At present, with the extensive development and application of liquid crystal display (LCD) technology, the displays with higher resolution have become one of the development trends of display technology. However, as a pixel resolution of the liquid crystal display becomes increasingly high, a pixel density of the liquid crystal display increases, thereby causing a screen transmittance to decrease. In the prior art, when the brightness of the liquid crystal display is insufficient, a method of increasing the backlight source current is generally used to increase the display brightness, thereby causing the power of the liquid crystal display to become increasingly high. Therefore, it is imperative to improve the transmittance of the liquid crystal display.

In a conventional LCD display device, a backlight usually enters from a TFT array substrate side and is emitted from a color film substrate side. For the array substrate of a TFT-LCD, a multilayer film structure has a great effect on light efficiency. When the refractive indices of adjacent film layers are different, the backlight has a high light reflection at a contact interface of adjacent film layers in the array substrate, thereby reducing the transmittance of the backlight.

SUMMARY

Embodiments of the present disclosure provide a display panel and a display device to improve the technical problem of low light output efficiency of a current display panel.

To realize the above functions, the present embodiments provide the following technical solutions.

An embodiment of the present disclosure provides a display panel including an opposing substrate, a liquid crystal layer, and an array substrate, wherein the liquid crystal layer is disposed between the opposing substrate and the array substrate;

the array substrate includes:
a base;
a first inorganic film layer disposed on the base, and having a refractive index greater than or equal to 1.4 and less than or equal to 1.6;
a conductive layer disposed on the base, wherein the conductive layer is adjacent to the first inorganic film layer;
wherein a material of the conductive layer includes indium tin oxide and a doping material including at least one of metal oxides, and a metal element of the metal oxides is one selected from one of Group IIA metal elements, Group IIIA metal elements, Group IIB metal elements, Group IIIB metal elements or lanthanide elements.

In the display panel provided in an embodiment of the present disclosure, the material of the conductive layer is a ternary oxide composed of indium oxide, tin oxide, and a first metal oxide, wherein the ternary oxide has a chemical formula of $In_xSn_yA_zO$, A is one of a magnesium element, a yttrium element, a gallium element, a zinc element, an aluminum element, or a lanthanide element, and all of x, y, and z are greater than 0.

In the display panel provided in an embodiment of the present disclosure, in the $In_xSn_yA_zO$, In atoms account for 70%-95% of the total metal atoms, Sn atoms account for 5%-30% of the total metal atoms, and A atoms account for 1%-20% of the total metal atoms.

In the display panel provided in an embodiment of the present disclosure, the material of the conductive layer is a quaternary oxide composed of indium oxide, tin oxide, a first metal oxide, and a second metal oxide, wherein the quaternary oxide has a chemical formula of $In_xSn_yA_zB_wO$, A is one of a magnesium element or a zinc element, B is one of a gallium element, a yttrium element, an aluminum element, or a lanthanum element, and all of x, y, z, and w are greater than 0.

In the display panel provided in an embodiment of the present disclosure, in the $In_xSn_yA_zB_wO$, In atoms account for 70%-95% of the total metal atoms, Sn atoms account for 5%-30% of the total metal atoms, A atoms account for 1%-20% of the total metal atoms, and B atoms account for 1%-20% of the total metal atoms.

In the display panel provided in an embodiment of the present disclosure, the conductive layer has a refractive index greater than or equal to 1.13 and less than 1.9.

In the display panel provided in an embodiment of the present disclosure, the array substrate includes:
a first metal layer disposed on the base;
a gate insulating layer disposed on the base and the first metal layer;
a second metal layer disposed on the gate insulating layer, and including a first electrode; and
a passivation layer disposed on the second metal layer and the gate insulating layer;
wherein the first inorganic film layer includes the gate insulating layer and the passivation layer, and the conductive layer includes the first electrode.

In the display panel provided in an embodiment of the present disclosure, the array substrate includes:
a first metal layer disposed on the base;
a gate insulating layer disposed on the base and the first metal layer;
a first passivation layer disposed on the gate insulating layer;
a second metal layer disposed on the first passivation layer, and including a first electrode; and
a second passivation layer disposed on the first passivation layer and the second metal layer;
wherein the first inorganic film layer includes the first passivation layer and the second passivation layer, and the conductive layer includes the first electrode.

In the display panel provided in an embodiment of the present disclosure, a refractive index of the second electrode is greater than a refractive index of the second passivation layer, a refractive index of the second passivation layer is greater than a refractive index of the first electrode, and a refractive index of the first electrode is greater than a refractive index of the first passivation layer.

An embodiment of the present disclosure provides a display device including a backlight module and a display panel as described above, wherein the backlight module is disposed on a back side of the display panel, the display panel includes an opposing substrate, a liquid crystal layer, and an array substrate, and the liquid crystal layer is disposed between the opposing substrate and the array substrate;

the array substrate includes:

a base;

a first inorganic film layer disposed on the base, and having a refractive index greater than or equal to 1.4 and less than or equal to 1.6;

a conductive layer disposed on the base, wherein the conductive layer is adjacent to the first inorganic film layer;

wherein a material of the conductive layer includes indium tin oxide and a doping material including at least one of metal oxides, and a metal element of the metal oxides is one selected from one of Group IIA metal elements, Group IIIA metal elements, Group IIB metal elements, Group IIIB metal elements or lanthanide elements.

In the display device provided in an embodiment of the present disclosure, the material of the conductive layer is a ternary oxide composed of indium oxide, tin oxide, and a first metal oxide, wherein the ternary oxide has a chemical formula of $In_xSn_yA_zO$, A is one of a magnesium element, a yttrium element, a gallium element, a zinc element, an aluminum element, or a lanthanide element, and all of x, y, and z are greater than 0.

In the display device provided in an embodiment of the present disclosure, in the $In_xSn_yA_zO$, In atoms account for 70%-95% of the total metal atoms, Sn atoms account for 5%-30% of the total metal atoms, and A atoms account for 1%-20% of the total metal atoms.

In the display device provided in an embodiment of the present disclosure, the material of the conductive layer is a quaternary oxide composed of indium oxide, tin oxide, a first metal oxide, and a second metal oxide, wherein the quaternary oxide has a chemical formula of $In_xSn_yA_zB_wO$, A is one of a magnesium element or a zinc element, B is one of a gallium element, a yttrium element, an aluminum element, or a lanthanum element, and all of x, y, z, and w are greater than 0.

In the display device provided in an embodiment of the present disclosure, in the $In_xSn_yA_zB_wO$, In atoms account for 70%-95% of the total metal atoms, Sn atoms account for 5%-30% of the total metal atoms, A atoms account for 1%-20% of the total metal atoms, and B atoms account for 1%-20% of the total metal atoms.

In the display device provided in an embodiment of the present disclosure, the conductive layer has a refractive index greater than or equal to 1.13 and less than 1.9.

In the display device provided in an embodiment of the present disclosure, the array substrate includes:

a first metal layer disposed on the base;

a gate insulating layer disposed on the base and the first metal layer;

a second metal layer disposed on the gate insulating layer, and including a first electrode; and a passivation layer disposed on the second metal layer and the gate insulating layer;

wherein the first inorganic film layer includes the gate insulating layer and the passivation layer, and the conductive layer includes the first electrode.

In the display device provided in an embodiment of the present disclosure, the array substrate includes:

a first metal layer disposed on the base;

a gate insulating layer disposed on the base and the first metal layer;

a first passivation layer disposed on the gate insulating layer;

a second metal layer disposed on the first passivation layer, and including a first electrode; and a second passivation layer disposed on the first passivation layer and the second metal layer;

wherein the first inorganic film layer includes the first passivation layer and the second passivation layer, and the conductive layer includes the first electrode.

In the display device provided in an embodiment of the present disclosure, a refractive index of the second electrode is greater than a refractive index of the second passivation layer, a refractive index of the second passivation layer is greater than a refractive index of the first electrode, and a refractive index of the first electrode is greater than a refractive index of the first passivation layer.

Embodiments of the present disclosure have the beneficial effect that: the embodiments of the present disclosure provide a display panel and a display device, wherein the display panel includes an opposing substrate, a liquid crystal layer, and an array substrate, the liquid crystal layer is disposed between the opposing substrate and the array substrate; the array substrate includes a base, a first inorganic film layer disposed on the base, and a conductive layer disposed on the base and the first inorganic film layer; the first inorganic film layer has a refractive index greater than or equal to 1.4 and less than or equal to 1.6, the conductive layer is adjacent to the first inorganic film layer. In the embodiments, on the basis of not changing the structure of the film layers of the array substrate, a material of the conductive layer is provided to include indium tin oxide and a doping material, the doping material includes at least one of Group IIA metal elements, Group IIIA metal elements, Group IIB metal elements, Group IIIB metal elements or lanthanide elements, thereby reducing the refractive index of the conductive layer, reducing the difference between the refractive index of the first inorganic film layer and the refractive index of the conductive layer, improving the transmittance of the array substrate, and improving the light source utilization efficiency of the backlight module of the display device.

BRIEF DESCRIPTION OF THE DRAWINGS

In order to more clearly illustrate the technical solutions of the embodiments of the present disclosure or in the prior art, the accompanying drawings which are to be used in the description of the embodiments of the present disclosure or the prior art will be shown below. It will be apparent that the accompanying drawings in the description below are merely some of the embodiments of the present disclosure, and other drawings may be obtained to those skilled in the art without involving any inventive effort.

DETAILED DESCRIPTION OF THE EMBODIMENTS

Figure 1:
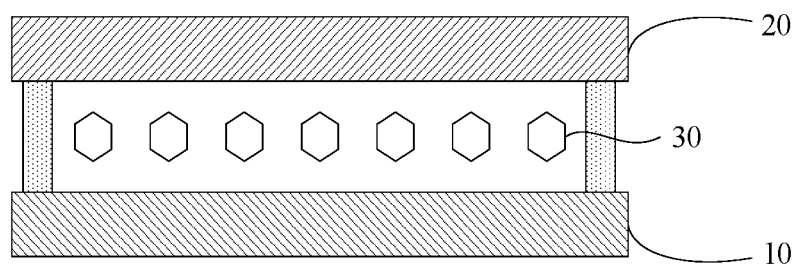
FIG. 1 is a schematic structural diagram of a display panel according to an embodiment of the present disclosure.

Technical solutions in the embodiments of the present disclosure will be clearly and completely described in connection with the accompanying drawings. It will be apparent that the described embodiments are merely a part of the embodiments of the present disclosure, rather than all the embodiments. Based on the embodiments in the present disclosure, all other embodiments obtained by a person skilled in the art without involving any inventive effort are within the scope of the present disclosure. Furthermore, it is to be understood that the specific embodiments described herein are for purposes of illustration and explanation only and are not intended to limit the application. In the present disclosure, in the absence of a statement to the contrary, orientation terms such as "on" and "under" are usually used to refer to a position on or under the device in its actual use or operating condition, specifically the orientation of the drawings in the accompanying drawings, and orientation terms such as "inside" and "outside" refer to a position relative to the profile of the device.

An embodiment of the present disclosure provides a display panel and a display device, and detailed descriptions thereof are given below. It is to be noted that the order in which the following embodiments are described is not intended to limit the preferred order of the embodiments.

Referring to FIGS. 1-4, the embodiments of the present disclosure provide a display panel and a display device, wherein the display panel includes an opposing substrate 20, a liquid crystal layer 30 and an array substrate 10, and the liquid crystal layer 30 is disposed between the opposing substrate 20 and the array substrate 10.

The array substrate 10 includes a base 100, a first inorganic film layer 1A disposed on the base 100, and a conductive layer 1B. The first inorganic film layer 1A has a refractive index greater than or equal to 1.4 and less than or equal to 1.6. The conductive layer 1B is disposed on the base 100 and is close to the first inorganic film layer 1A. A material of the conductive layer 1B includes indium tin oxide, and a doping material including at least one of metal oxides, wherein a metal element of the metal oxides is selected from one of Group IIA metal elements, Group IIIA metal elements, Group IIB metal elements, Group IIIB metal elements, and lanthanide elements.

It is to be noted that the technical solutions of the present embodiment are described by taking the display panel as a liquid crystal display (LCD) and the opposing substrate as a color film substrate as an example.

It is to be understood that, the present embodiment provides the material of the conductive layer to include indium tin oxide and the doping material including at least one of the metal oxides, and the metal element of the metal oxides is selected from one of Group IIA metal elements, Group IIIA metal elements, Group IIB metal elements, Group IIIB metal elements, and lanthanide elements, so that the refractive index of the conductive layer is reduced, thereby reducing the difference between the refractive index of the first inorganic film layer and the refractive index of the conductive layer, improving the transmittance of the array substrate, and improving the light source utilization efficiency of the backlight module of the display device.

Figure 2:
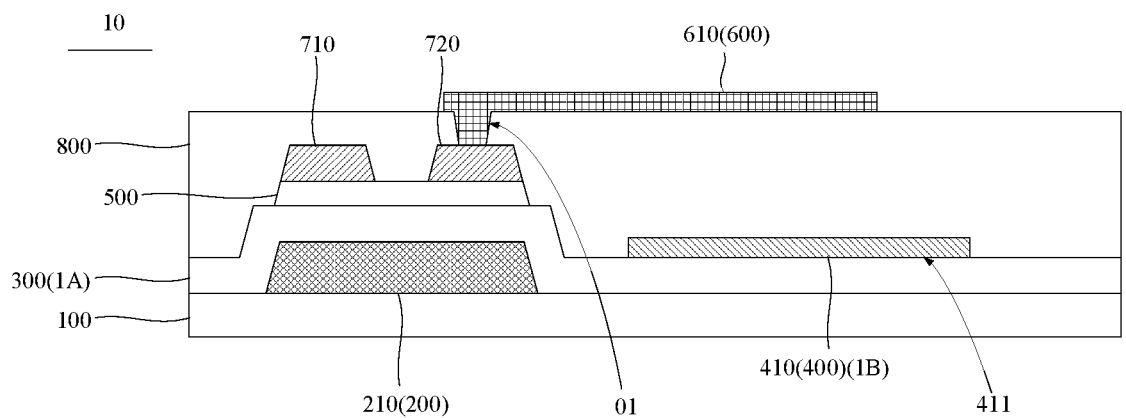
FIG. 2 is a first schematic cross-sectional view of an array substrate according to an embodiment of the present disclosure.

In an embodiment, referring to FIGS. 1 and 2, FIG. 2 is a first schematic cross-sectional view of an array substrate according to an embodiment of the present disclosure.

In the present embodiment, the array substrate 10 includes a base 100 and a first metal layer 200, a gate insulating layer 300, a second metal layer 400, a passivation layer 800, and a third metal layer 600 that are stacked on the base 100. The gate insulating layer 300 is disposed on the base 100 and the first metal layer 200. The second metal layer 400 includes a first electrode 410, which is one of a pixel electrode and a common electrode. The passivation layer 800 is disposed on the second metal layer 400 and the gate insulating layer 300. The third metal layer 600 includes a second electrode 610, which is the other of the pixel electrode and the common electrode. The first inorganic film layer 1A includes the gate insulating layer 300 and the passivation layer 800, and the conductive layer 1B includes the first electrode 410. The material of the first electrode 410 includes indium tin oxide and the doping material including at least one of the metal oxides, and the metal element of the metal oxides is selected from one of Group IIA metal elements, Group IIIA metal elements, Group IIB metal elements, Group IIIB metal elements, and lanthanide elements.

It is to be noted that in the present embodiment, when the first inorganic film layer 1A is the gate insulating layer 300, the conductive layer 1B is the first electrode 410 in direct contact with the gate insulating layer 300.

Further, the material of the first electrode 410 is a ternary oxide composed of indium oxide, tin oxide, and a first metal oxide. The ternary oxide has a chemical formula of $In_xSn_yA_zO$, wherein A is one of a magnesium element, a yttrium element, a gallium element, a zinc element, an aluminum element, and a lanthanide element, and all of x, y, and z are greater than 0.

It is to be noted that in the present embodiment, the first electrode 410 and the second electrode 610 may be any combination of the pixel electrode and the common electrode. Specifically, when the first electrode 410 is the pixel electrode, the second electrode 610 is the common electrode. Alternatively, when the first electrode 410 is the common electrode, the second electrode 610 is the pixel electrode. In addition, the array substrate 10 includes a plurality of thin film transistors, which may have a top gate structure or a bottom gate structure. Specifically, the technical solutions of the present embodiment will be described below by taking the thin film transistors with the bottom gate structure as an example.

It is to be understood that when the thin film transistors are of the bottom gate structure, the array substrate 10 further includes an active layer 500, a source electrode 710, a drain electrode 720, and a first via hole 01. The active layer 500 is located on a side of the gate insulating layer 300 away from the first metal layer 200. The source electrode 710 and the drain electrode 720 are located on a side of the active layer 500 away from the gate insulating layer 300. The first metal layer 200 includes a gate electrode 210. The passivation layer 800 is located on the source electrode 710, the drain electrode 720, the first electrode 410, and the gate insulating layer 300. The first via hole 01 penetrates through the passivation layer 800. It is to be noted that the active layer 500 is disposed corresponding to the gate electrode 210, and two ends of the active layer 500 are connected to the source electrode 710 and the drain electrode 720, respectively.

It is to be noted that the technical solutions of the present disclosure are illustrated by taking the first electrode 410 as the pixel electrode, and the second electrode 610 as the common electrode, as an example. Specifically, an end of the second electrode 610 is connected to the drain electrode 720 through the first via 01.

The active layer 500 includes, but is not limited to, an oxide semiconductor layer. A material of the oxide semiconductor layer includes, but is not limited to, indium gallium zinc oxide (IGZO), indium tin zinc oxide (ITZO), or indium gallium zinc tin oxide (IGZTO). A material of the gate insulating layer 300 includes, but is not limited to, silicon oxide ($SiO_x$). A material of the passivation layer 800 includes, but is not limited to, silicon oxide ($SiO_x$). Further, the material of the gate insulating layer 300 is preferably silicon oxide ($SiO_x$), and a refractive index of the gate insulating layer 300 is greater than or equal to 1.4 and less than or equal to 1.6. The material of the passivation layer 800 is preferably silicon oxide ($SiO_x$), and a refractive index of the passivation layer 800 is greater than or equal to 1.4 and less than or equal to 1.6.

It is to be understood that, at present, the existing liquid crystal display device includes a liquid crystal display panel and a backlight module located on a back side of the liquid crystal display panel, wherein a backlight source of the backlight module generally enters from an array substrate side of the liquid crystal display panel and is emitted from a color film substrate side of the liquid crystal display panel. For the existing array substrate, the multilayer film structure has a great effect on light efficiency. When refractive indices of adjacent film layers are different, the backlight source has a relatively high light reflection at a contact interface of adjacent film layers in the array substrate. For example, in the Oxide TFT liquid crystal display panel, there is a contact interface between the transparent conductive layer and the insulating layer, and the reflectivity of the contact interface, the refractive index of the transparent conductive layer, and the refractive index of the insulating layer meet the following equation:

$$n_{12} = \left(\frac{n_1 - n_2}{n_1 + n_2}\right)^2 \quad (1)$$

Wherein, $n_{12}$ is the reflectivity of the contact interface; $n_1$ is the refractive index of the transparent conductive layer 1B, and $n_2$ is the refractive index of the insulating layer. It is apparent that reducing the difference in the optical refractive indices between adjacent film layers is one of the effective methods to improve the transmittance of the array substrate. However, the existing Oxide TFT liquid crystal display panel is limited by the fixed refractive index of each film layer material of the conventional display panel 1, so that the light output efficiency of the conventional display panel is difficult to change.

In this embodiment, the material of the first electrode 410 is the ternary oxide composed of indium oxide, tin oxide, and the first metal oxide, wherein the ternary oxide has the chemical formula of $In_xSn_yA_zO$, A is one of a magnesium element, a yttrium element, a gallium element, a zinc element, an aluminum element, or a lanthanide element, and all of x, y, and z are greater than 0, thereby reducing the refractive index of the first electrode 410, further reducing the difference between the refractive index of the gate insulating layer 300 and the refractive index of the first electrode 410, and improving the transmittance of the array substrate 10.

Specifically, in the $In_xSn_yA_zO$, In atoms account for 70%-95% of the total metal atoms, Sn atoms account for 5%-30% of the total metal atoms, and A atoms account for 1%-20% of the total metal atoms, wherein the above percentages are based on molar ratios. A is preferably a zinc element, and the zinc atoms account for 1%-20% of the total metal atoms. It is to be noted that in the present embodiment, the A atoms account for 1%-20% of the total metal atoms, so as to avoid damage to the transparent conductive property of indium oxide ($In_2O_3$) after being added the doping material.

In the present embodiment, the refractive index of the conductive layer 1B is greater than or equal to 1.13 and less than 1.9. That is, the refractive index of the first electrode 410 is greater than or equal to 1.13 and less than 1.9. The refractive index of the first electrode 410 is preferably one of 1.2, 1.3, 1.4, 1.5, 1.6, 1.7, or 1.8.

In the present embodiment, a first contact surface 411 is disposed between the first electrode 410 and the gate insulating layer 300, as an example, so as to illustrate the technical solutions of the present invention. The reflectivity of the first contact surface 411, the refractive index of the first electrode 410, and the refractive index of the gate insulating layer 300 meet the following equation:

$$n_{ab} = \left(\frac{n_a - n_b}{n_a + n_b}\right)^2 \quad (2)$$

Wherein, $n_{ab}$ is the reflectivity of the first contact surface 411, $n_a$ is the refractive index of the first electrode 410, and $n_b$ is the refractive index of the gate insulating layer 300.

It is to be noted that, referring to the above equation (1), the technical solutions of the present embodiment are illustrated by taking the transparent conductive layer as the pixel electrode in the existing Oxide TFT liquid crystal display panel, as an example. It is to be understood that, in the existing Oxide TFT liquid crystal display panel, a material of the pixel electrode is generally indium tin oxide (ITO) or indium zinc oxide (IZO) and has a refractive index greater than or equal to 1.9 and less than or equal to 2.1, a material of the insulating layer is silicon oxide ($SiO_x$) and has a refractive index greater than or equal to 1.4 and less than or equal to 1.6, and the contact interface has a first reflectivity of $n_{12}$.

With continued to the above, referring to the above equation (2), in this embodiment, the first electrode 410 has the refractive index greater than or equal to 1.13 and less than 1.9, the gate insulating layer 300 has the refractive index greater than or equal to 1.4 and less than or equal to 1.6, and the first contact surface has a second refractive index $n_{ab}$. It is apparent that in this embodiment, the material of the first electrode 410 is the ternary oxide composed of indium oxide, tin oxide, and the first metal oxide, wherein the ternary oxide has the chemical formula of $In_xSn_yA_zO$, A is one of a magnesium element, a yttrium element, a gallium element, a zinc element, an aluminum element, or a lanthanide element, and all of x, y, and z are greater than 0, thereby reducing the refractive index of the first electrode 410, further reducing the difference between the refractive index of the gate insulating layer 300 and the refractive index of the first electrode 410, and improving the transmittance of the array substrate 10.

Further, in the present embodiment, a refractive index of the second electrode 610 is greater than the refractive index of the passivation layer 800, the refractive index of the passivation layer 800 is greater than the refractive index of the first electrode 410, and the refractive index of the first electrode 410 is greater than the refractive index of the gate insulating layer 300, so that the backlight source enters from the optically thinner medium into the optically denser medium in the array substrate 10, thereby reducing the reflected light energy, reducing the reflectivity of the backlight source at the contact interface of adjacent film layers in the array substrate 10, and improving the transmittance of the backlight source in the array substrate 10.

In another embodiment, the material of the conductive layer 1B includes indium tin oxide and a doped material including two metal oxides. Specifically, the material of the conductive layer 1B is a quaternary oxide composed of indium oxide, tin oxide, a first metal oxide, and a second metal oxide, wherein the quaternary oxide has a chemical formula of $In_xSn_yA_zB_wO$, A is one of a magnesium element or a zinc element, B is one of a gallium element, a yttrium element, an aluminum element, or a lanthanum element, and all of x, y, z, and w are greater than 0.

Further, in the $In_xSn_yA_zB_wO$, In atoms account for 70%-95% of the total metal atoms, Sn atoms account for 5%-30% of the total metal atoms, A atoms account for 1%-20% of the total metal atoms, and B atoms account for 1%-20% of the total metal atoms.

It is to be understood that in the present embodiment, the material of the conductive layer 1B is the quaternary oxide composed of indium oxide, tin oxide, the first metal oxide, and the second metal oxide, wherein the quaternary oxide has the chemical formula of $In_xSn_yA_zB_wO$, A is one of a magnesium element or a zinc element, B is one of a gallium element, a yttrium element, an aluminum element, or a lanthanum element, and all of x, y, z, and w are greater than 0, thereby reducing the refractive index of the conductive layer, reducing the difference between the refractive index of the first inorganic film layer and the refractive index of the conductive layer, improving the transmittance of the array substrate, and improving the light source utilization efficiency of the backlight module of the display device.

Figure 3:
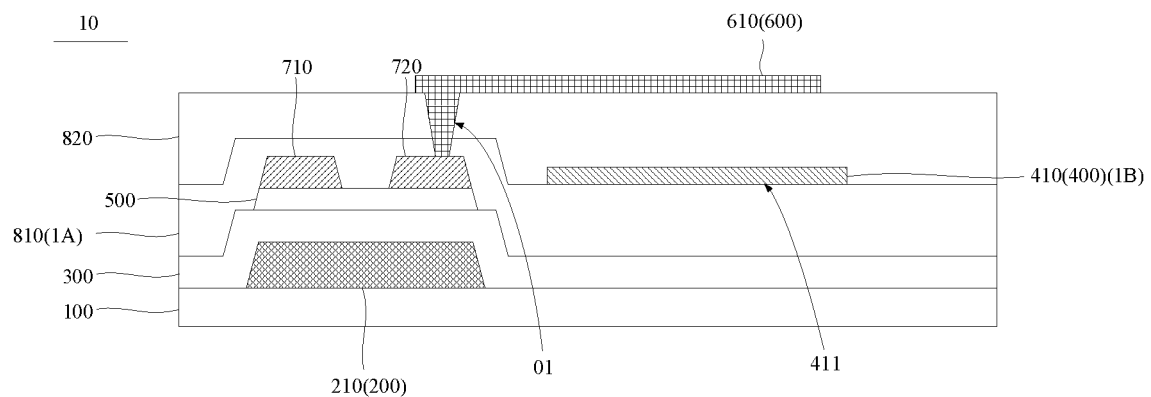
FIG. 3 is a second schematic cross-sectional view of an array substrate according to an embodiment of the present disclosure.

In an embodiment, with referring to FIGS. 1 and 3, FIG. 3 is a second schematic structure diagram of an array substrate according to an embodiment of the present disclosure. In this embodiment, the structure of the array substrate is similar/identical to the first structure of the array substrate according to the above embodiment. Specifically, reference is made to the description of the array substrate in the above embodiments, details are not described herein, and the difference between the first and second structures lies in the following:

In this embodiment, the array substrate 10 includes the base 100, and the first metal layer 200, the gate insulating layer 300, a first passivation layer 810, the second metal layer 400, a second passivation layer 820, and the third metal layer 600 that are stacked on the base 100. The gate insulating layer 300 is disposed on the base 100 and the first metal layer 200, and the first passivation layer 810 is disposed on the gate insulating layer 300. The second metal layer 400 includes the first electrode 410, which is one of the pixel electrode and the common electrode. The second passivation layer 820 is disposed on the first passivation layer 810 and the second metal layer 400. The third metal layer 600 includes the second electrode 610, which is the other of the pixel electrode and the common electrode. The first inorganic film layer 1A includes the first passivation layer 810 and the second passivation layer 820, and the conductive layer 1B includes the first electrode 410.

It is to be noted that in this embodiment, when the first inorganic film layer 1A is the first passivation layer 810, the conductive layer 1B is the first electrode 410 in direct contact with the first passivation layer 810.

In the present embodiment, the first via 01 sequentially penetrates through the second passivation layer 820 and the active layer 500, and an end of the second electrode 610 is connected to the drain electrode 720 through the first via 01.

The active layer 500 includes, but is not limited to, an oxide semiconductor layer. A material of the oxide semiconductor layer includes but is not limited to indium gallium zinc oxide (IGZO), indium tin zinc oxide (ITZO), or indium gallium zinc tin oxide (IGZTO). A material of the first passivation layer 810 includes but is not limited to silicon oxide ($SiO_x$), and a material of the second passivation layer 820 includes but is not limited to silicon oxide ($SiO_x$). Further, the material of the first passivation layer 810 is preferably silicon oxide ($SiO_x$), and a refractive index of the first passivation layer 810 is greater than or equal to 1.4 and less than or equal to 1.6. The material of the second passivation layer 820 is preferably silicon oxide ($SiO_x$), and a refractive index of the second passivation layer 820 is greater than or equal to 1.4 and less than or equal to 1.6.

It is to be understood that in the present embodiment, the material of the first electrode 410 is the ternary oxide composed of indium oxide, tin oxide, and a first metal oxide, wherein the ternary oxide has the chemical formula of $In_xSn_yA_zO$, A is one of a magnesium element, a yttrium element, a gallium element, a zinc element, an aluminum element, or a lanthanide element, and all of x, y, and z are greater than 0, thereby reducing the refractive index of the first electrode 410, reducing the difference between the refractive index of the first passivation layer 810 and the refractive index of the first electrode 410, and improving the transmittance of the array substrate 10.

Figure 4:
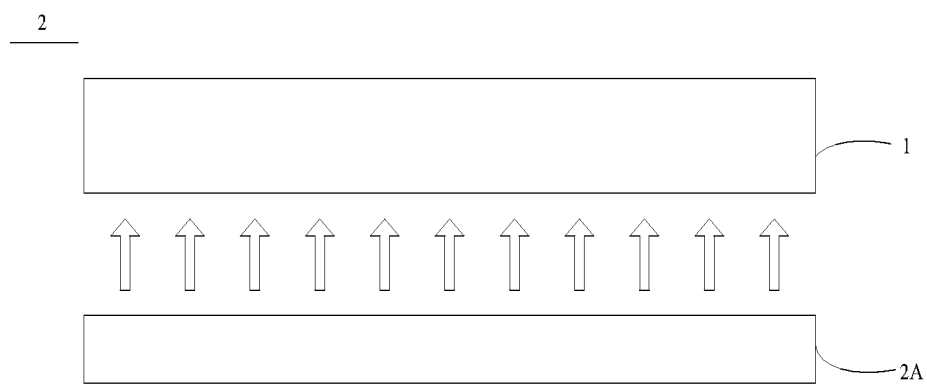
FIG. 4 is a schematic structural diagram of a display device according to an embodiment of the present disclosure.

Referring to FIGS. 1 and 4, FIG. 4 is a schematic structural diagram of a display device according to an embodiment of the present disclosure.

The present embodiment provides a display device 2, including a backlight module 2A and the display panel 1 described in any one of the above embodiments. The backlight module 2A is disposed on a back side of the display panel 1.

It is to be understood that the display panel 1 has been described in detail in the above embodiments, and the detailed description is not repeated here. In the present embodiment, the material of the conductive layer 1B includes indium tin oxide and a doping material. The doping material includes at least one of the metal oxides in which the metal element is selected from one of Group IIA metal elements, Group IIIA metal elements, Group IIB metal elements, Group IIIB metal elements, or lanthanide elements, thereby reducing the refractive index of the conductive layer 1B, reducing the difference between the refractive index of the first inorganic film layer 1A and the refractive index of the conductive layer 1B, improving the transmittance of the array substrate 10, and improving the light source utilization efficiency of the backlight module of the display device 2.

In particular applications, the display device 2 may be a display screen of a smartphone, a tablet computer, a notebook computer, a smart wristband, a smart watch, smart glasses, a smart helmet, a desktop computer, a smart television, a digital camera, or the like, or even may be applied in an electronic device having a flexible display screen.

In summary, the embodiments of the present disclosure provide the display panel and the display device, wherein the display panel includes the opposing substrate, the liquid crystal layer, and the array substrate. The liquid crystal layer is disposed between the opposing substrate and the array substrate. The array substrate includes the base, the first inorganic film layer disposed on the base, and the conductive layer disposed on the base and the first inorganic film layer. The refractive index of the first inorganic film layer is greater than or equal to 1.4 and less than or equal to 1.6. The conductive layer is adjacent to the first inorganic film layer. In the embodiments, on the basis of not changing the film layer structure of the array substrate, the material of the conductive layer is provided to include indium tin oxide and the doping material, the doping material includes at least one of the metal oxides, and the metal element of the metal oxides is selected from one of a Group IIA metal element, a Group IIIA metal element, a Group IIB metal element, a Group IIIB metal element, or a lanthanide element, thereby reducing the refractive index of the conductive layer, reducing the difference between the refractive index of the first inorganic film layer and the refractive index of the conductive layer, improving the transmittance of the array substrate, and improving the light source utilization efficiency of the backlight module of the display device.

A display panel and a display device provided by the embodiments of the present disclosure have been introduced in detail above, specific examples are used herein to illustrate the principles and implementation methods of the present disclosure. The description of the above embodiments is merely provided to help understand the method of the present disclosure and the core idea thereof. Meanwhile, the specific implementation and application scope will be changed to those skilled in the art in accordance with the teachings of the present disclosure. In view of the foregoing, the present description should not be construed as limiting the application.

What is claimed is:

1. A display panel, comprising an opposing substrate, a liquid crystal layer, and an array substrate,
    wherein the liquid crystal layer is disposed between the opposing substrate and the array substrate;
    wherein the array substrate comprises:
        a base;
        a first inorganic film layer disposed on the base, and having a refractive index greater than or equal to 1.4 and less than or equal to 1.6; and
        a conductive layer disposed on the base, wherein the conductive layer is adjacent to the first inorganic film layer; and
    a material of the conductive layer has a chemical formula of $In_xSn_yA_zO$, wherein A is a first metal element selected from one of a magnesium element, a yttrium element, a gallium element, a zinc element, an aluminum element, or a lanthanide element, all of x, y, and z are greater than 0, In atoms account for 70%-95% of total metal atoms, Sn atoms account for 5%-30% of the total metal atoms, and A atoms account for 1%-20% of the total metal atoms.

2. The display panel according to claim 1, wherein the material of the conductive layer further comprises a second metal element B, and has a chemical formula of $In_xSn_yA_zB_wO$, wherein A is one of a magnesium element or a zinc element, B is one of a gallium element, a yttrium element, an aluminum element, or a lanthanum element, and all of x, y, z, and w are greater than 0.

3. The display panel according to claim 2, wherein in the $In_xSn_yA_zB_wO$, In atoms account for 70%-95% of the total metal atoms, Sn atoms account for 5%-30% of the total metal atoms, A atoms account for 1%-20% of the total metal atoms, and B atoms account for 1%-20% of the total metal atoms.

4. The display panel according to claim 1, wherein the conductive layer has a refractive index greater than or equal to 1.13 and less than 1.9.

5. The display panel according to claim 1, wherein the array substrate comprises:
    a first metal layer disposed on the base;
    a gate insulating layer disposed on the base and the first metal layer;
    a second metal layer disposed on the gate insulating layer, and comprising a first electrode; and
    a passivation layer disposed on the second metal layer and the gate insulating layer;
    wherein the first inorganic film layer comprises the gate insulating layer and the passivation layer, and the conductive layer comprises the first electrode.

6. The display panel according to claim 1, wherein the array substrate comprises:
    a first metal layer disposed on the base;
    a gate insulating layer disposed on the base and the first metal layer;
    a first passivation layer disposed on the gate insulating layer;
    a second metal layer disposed on the first passivation layer, and comprising a first electrode; and
    a second passivation layer disposed on the first passivation layer and the second metal layer;
    wherein the first inorganic film layer comprises the first passivation layer and the second passivation layer, and the conductive layer comprises the first electrode.

7. The display panel according to claim 6, wherein the array substrate further comprises a third metal layer disposed on the second passivation layer, and the third metal layer comprises a second electrode, and a refractive index of the second electrode is greater than a refractive index of the second passivation layer, a refractive index of the second passivation layer is greater than a refractive index of the first electrode, and a refractive index of the first electrode is greater than a refractive index of the first passivation layer.

8. A display device comprising a backlight module and a display panel, wherein the backlight module is disposed on a back side of the display panel, the display panel comprises an opposing substrate, a liquid crystal layer, and an array substrate, and the liquid crystal layer is disposed between the opposing substrate and the array substrate;
    the array substrate comprises:
        a base;
        a first inorganic film layer disposed on the base, and having a refractive index greater than or equal to 1.4 and less than or equal to 1.6; and
        a conductive layer disposed on the base, wherein the conductive layer is adjacent to the first inorganic film layer;
        a material of the conductive layer has a chemical formula of $In_xSn_yA_zO$, A is a first metal element selected from one of a magnesium element, a yttrium element, a gallium element, a zinc element, an aluminum element, or a lanthanide element, all of x, y, and z are greater than 0, In atoms account for 70%-95% of total metal atoms, Sn atoms account for 5%-30% of the total metal atoms, and A atoms account for 1%-20% of the total metal atoms.

9. The display device according to claim 8, wherein the material of the conductive layer further comprises a second metal element B, and wher has a chemical formula of $In_xSn_yA_zBw_O$, wherein A is one of a magnesium element or a zinc element, B is one of a gallium element, a yttrium element, an aluminum element, or a lanthanum element, and all of x, y, z, and w are greater than 0.

10. The display device according to claim 9, wherein in the $In_xSn_yA_zB_wO$, In atoms account for 70%-95% of the total metal atoms, Sn atoms account for 5%-30% of the total metal atoms, A atoms account for 1%-20% of the total metal atoms, and B atoms account for 1%-20% of the total metal atoms.

11. The display device according to claim 8, wherein the conductive layer has a refractive index greater than or equal to 1.13 and less than 1.9.

12. The display device according to claim 8, wherein the array substrate comprises:
a first metal layer disposed on the base;
a gate insulating layer disposed on the base and the first metal layer;
a second metal layer disposed on the gate insulating layer, and comprising a first electrode; and
a passivation layer disposed on the second metal layer and the gate insulating layer;
wherein the first inorganic film layer comprises the gate insulating layer and the passivation layer, and the conductive layer comprises the first electrode.

13. The display device according to claim 8, wherein the array substrate comprises:
a first metal layer disposed on the base;
a gate insulating layer disposed on the base and the first metal layer;
a first passivation layer disposed on the gate insulating layer;
a second metal layer disposed on the first passivation layer, and comprising a first electrode; and
a second passivation layer disposed on the first passivation layer and the second metal layer;
wherein the first inorganic film layer comprises the first passivation layer and the second passivation layer, and the conductive layer comprises the first electrode.

14. The display device according to claim 13, wherein the array substrate further comprises a third metal layer disposed on the second passivation layer, and the third metal layer comprises a second electrode, and
a refractive index of the second electrode is greater than a refractive index of the second passivation layer, a refractive index of the second passivation layer is greater than a refractive index of the first electrode, and a refractive index of the first electrode is greater than a refractive index of the first passivation layer.

* * * * *